(12) United States Patent
Zhu

(10) Patent No.: US 12,047,209 B2
(45) Date of Patent: Jul. 23, 2024

(54) AUTOMATIC GAIN CONTROL METHOD, SENSOR, AND RADIO DEVICE

(71) Applicant: CALTERAH SEMICONDUCTOR TECHNOLOGY (SHANGHAI) CO., LTD., Shanghai (CN)

(72) Inventor: Yan Zhu, Shanghai (CN)

(73) Assignee: CALTERAH SEMICONDUCTOR TECHNOLOGY (SHANGHAI) CO., LTD. (CN)

( * ) Notice: Subject to any disclaimer, the term of this patent is extended or adjusted under 35 U.S.C. 154(b) by 83 days.

(21) Appl. No.: 17/908,315

(22) PCT Filed: Feb. 25, 2021

(86) PCT No.: PCT/CN2021/077811
§ 371 (c)(1),
(2) Date: Aug. 31, 2022

(87) PCT Pub. No.: WO2021/175144
PCT Pub. Date: Sep. 10, 2021

(65) Prior Publication Data
US 2023/0099685 A1 Mar. 30, 2023

(30) Foreign Application Priority Data
Mar. 2, 2020 (CN) .......................... 202010136325.8

(51) Int. Cl.
*H04L 27/10* (2006.01)
*G01S 7/35* (2006.01)
*H04L 1/00* (2006.01)

(52) U.S. Cl.
CPC .............. *H04L 27/10* (2013.01); *G01S 7/352* (2013.01); *H04L 1/0033* (2013.01); *H04L 1/0036* (2013.01)

(58) Field of Classification Search
CPC ............................. H04B 17/204; H01Q 1/002
See application file for complete search history.

(56) References Cited

U.S. PATENT DOCUMENTS 5,991,234 A * 11/1999 Sejalon ................ B06B 1/0246
367/13
6,832,251 B1 * 12/2004 Gelvin .................... G01V 1/22
709/224
(Continued)

FOREIGN PATENT DOCUMENTS

CN 1305089 A * 7/2001 .......... G06F 3/0481
CN 1120990 C * 9/2003 .......... G06F 3/0481
(Continued)

OTHER PUBLICATIONS

Search Report issued in corresponding European Application No. 21765512.5 on Oct. 30, 2023.
(Continued)

*Primary Examiner* — Berhanu Tadese
(74) *Attorney, Agent, or Firm* — The Belles Group, P.C.

(57) ABSTRACT

An automatic gain control method, sensor (700), and radio device (900); by means of using the saturation information of a test echo unit to adjust the gain coefficient of a transmitting and receiving link, it is ensured that the received signal power used for target detection is located within a rated threshold range, further improving the accuracy of sensor (700) target detection, and avoiding defects such as missed detection, false detection, and even blindness.

17 Claims, 5 Drawing Sheets

(56) References Cited

U.S. PATENT DOCUMENTS

| | | | | |
|---|---|---|---|---|
| 7,436,905 | B2 * | 10/2008 | Shirakawa | H03G 3/3052 |
| | | | | 375/316 |
| 8,001,841 | B2 * | 8/2011 | Thomas | G01N 29/44 |
| | | | | 73/602 |
| 8,001,842 | B2 * | 8/2011 | Thomas | G01N 29/043 |
| | | | | 73/602 |
| 9,891,311 | B2 | 2/2018 | Leong et al. | |
| 10,014,960 | B1 * | 7/2018 | Porat | H04W 4/023 |
| 10,033,367 | B2 | 7/2018 | Pavao-Moreira et al. | |
| 10,656,222 | B2 * | 5/2020 | Patulea | G01R 33/3621 |
| 11,184,779 | B2 * | 11/2021 | Lee | H04B 7/0617 |
| 11,442,137 | B2 * | 9/2022 | Seth | G01S 5/0278 |
| 2007/0135071 | A1 | 6/2007 | Lee et al. | |
| 2007/0165489 | A1 | 7/2007 | Inouchi et al. | |
| 2007/0169549 | A1 * | 7/2007 | Kwun | G01F 23/2965 |
| | | | | 73/290 V |
| 2008/0091350 | A1 * | 4/2008 | Smith | G01S 19/46 |
| | | | | 701/472 |
| 2008/0273636 | A1 | 11/2008 | Zhu et al. | |
| 2010/0189188 | A1 | 7/2010 | Li et al. | |
| 2018/0218073 | A1 | 8/2018 | Wilshinsky et al. | |
| 2023/0099685 | A1 * | 3/2023 | Zhu | G01S 7/4013 |
| | | | | 375/262 |

FOREIGN PATENT DOCUMENTS

| | | | | |
|---|---|---|---|---|
| CN | 101090302 | A | | 12/2007 |
| CN | 101151840 | A * | 3/2008 | H04N 19/40 |
| CN | 201286157 | Y * | 8/2009 | G06F 3/0481 |
| CN | 101650570 | A * | 2/2010 | G06F 3/0481 |
| CN | 101719775 | A * | 6/2010 | G06F 3/0481 |
| CN | 101849404 | A * | 9/2010 | G06F 3/0481 |
| CN | 101359942 | B * | 12/2010 | G06F 3/0481 |
| CN | 101151840 | B * | 9/2011 | H04N 19/40 |
| CN | 102215556 | A | | 10/2011 |
| CN | 102273164 | A | | 12/2011 |
| CN | 101650570 | B * | 5/2012 | G06F 3/0481 |
| CN | 101331395 | B * | 6/2012 | G01N 29/043 |
| CN | 102594275 | A | | 7/2012 |
| CN | 102706958 | A * | 10/2012 | G01N 29/043 |
| CN | 101719775 | B * | 4/2013 | G06F 3/0481 |
| CN | 203720372 | U * | 7/2014 | G06F 3/0481 |
| CN | 102706958 | B * | 10/2014 | G01N 29/043 |
| CN | 104955400 | A * | 9/2015 | G06F 3/0481 |
| CN | 106203222 | A * | 12/2016 | G06K 7/10019 |
| CN | 206147647 | U * | 5/2017 | G06F 3/0481 |
| CN | 104955400 | B * | 6/2017 | A61B 8/145 |
| CN | 107064900 | A * | 8/2017 | G01S 7/414 |
| CN | 107276621 | A | | 10/2017 |
| CN | 101849404 | B * | 1/2018 | G06F 3/0481 |
| CN | 107632307 | A | | 1/2018 |
| CN | 107809258 | A | | 3/2018 |
| CN | 107861112 | A | | 3/2018 |
| CN | 107944855 | A * | 4/2018 | G06F 3/0481 |
| CN | 108009815 | A * | 5/2018 | G06F 3/0481 |
| CN | 106203222 | B * | 6/2019 | G06K 7/10019 |
| CN | 110324054 | A | | 10/2019 |
| CN | 110447146 | A * | 11/2019 | H01L 23/4855 |
| CN | 112534302 | A * | 3/2021 | G06F 3/0481 |
| CN | 112534302 | B * | 2/2022 | G06F 3/0481 |
| DE | 112017006442 | T5 * | 9/2019 | H01L 23/4855 |
| EP | 1946095 | B1 * | 7/2018 | G01N 29/043 |
| ES | 2688195 | T3 * | 10/2018 | G01N 29/043 |
| FR | 2760306 | A1 * | 9/1998 | H04N 5/44 |
| JP | 05308568 | A * | 11/1993 | G06F 3/0481 |
| JP | 2009194797 | A * | 8/2009 | G01C 19/56 |
| JP | 2009194798 | A * | 8/2009 | G01C 19/56 |
| JP | 5262164 | B2 * | 8/2013 | G01C 19/56 |
| JP | 5262165 | B2 * | 8/2013 | G01C 19/56 |
| JP | 5430151 | B2 * | 2/2014 | G01N 29/043 |
| WO | WO-2010138601 | A2 * | 12/2010 | H03G 3/3078 |
| WO | WO-2018112188 | A1 * | 6/2018 | G01R 33/3621 |
| WO | WO-2018119153 | A2 * | 6/2018 | H01L 23/4855 |
| WO | WO-2020164121 | A1 * | 8/2020 | G06F 3/0481 |

OTHER PUBLICATIONS

Office Action issued in corresponding Chinese Application No. CN202110210922.5 on May 24, 2022.

Xu, Shuo, et al. Algorithm for transmission power control based on chirp signal, Fishery Modernization, vol. 42 No. 5, Oct. 20, 2015, pp. 48-52. DOI: 10.3969/j.issn.1007-9580.2015.05.010.

* cited by examiner

AUTOMATIC GAIN CONTROL METHOD, SENSOR, AND RADIO DEVICE

CROSS-REFERENCE TO RELATED PATENT APPLICATIONS

This application is a § 371 National Stage Entry of Patent Cooperation Treaty (PCT) Application No. PCT/CN2021/077811, titled "AUTOMATIC GAIN CONTROL METHOD, SENSOR, AND RADIO DEVICE", filed on Feb. 25, 2021, that claims the benefit of and priority to Chinese Patent Application No. 202010136325.8, titled "AUTOMATIC GAIN CONTROL METHOD, SENSOR, AND RADIO DEVICE", filed on Mar. 2, 2020 with the China National Intellectual Property Administration, the contents of both of which are incorporated herein by reference in their respective entirety, for all purposes.

TECHNICAL FIELD

This disclosure relates to automatic gain control technology, specifically to a method for automatic gain control, a sensor and a radio device.

BACKGROUND

In sensor (radar for example) applications, due to the changing factors of the shape, size and range of the reflectors (or objects), the signals received by the sensor (echo signals) will change in strength accordingly.

However, there is a strength limit for the signals to be received by receiving (RX) chains of a sensor. In other words, there is a maximum received signal strength for the RX chains of a sensor. When the strength of an echo signal exceeds the maximum strength, the signal received by the RX chains will be distorted and therefore the RX chains will be unable to obtain the information of the detected object, which is basically "blind". Similarly, there is a minimum received signal strength for the RX chains of a sensor. When the strength of an echo signal is smaller than the minimum strength, quantization noise is introduced in the signal received by RX chains, which leads to malfunction of the sensor, including missed detection and false detection.

SUMMARY

In light of the above-mentioned factors, this disclosure provides a method for automatic gain control (AGC), a sensor and a radio device. By adjusting the gain for transmitting (TX) and receiving (RX) chain based on the saturation information of test echo signals, it is ensured that the power of received signals for object detection is within predefined range. In this way, detection accuracy of the sensor can be improved, and missed detection, false detection and even blinding can be avoided.

To address the issues, the technical solutions provided by this disclosure are in the following.

In a first aspect, this disclosure provides a method for AGC that can be applied in the TX and RX chain of a sensor; in the radio signals transmitted by the TX and RX chain, a signal frame includes a plurality of continuous unit signals, wherein the plurality of unit signals include N test unit signals and at least one scanning unit signal; the method includes the following steps: acquiring saturation information of the ith test echo unit signal corresponding to the ith test unit signal, wherein i and N are positive integers, $i \leq N-1$ and $2 \leq N$;

determining an (i+1)th preamble gain according to the saturation information of at least one test echo unit signal in first i test echo unit signals;

transmitting, by the transmitting and receiving chain, an (i+1)th test unit signal based on the (i+1)th preamble gain and/or receiving, by the transmitting and receiving chain, an (i+1)th test echo unit signal based on the (i+1)th preamble gain;

sequentially circulating until $i=N-1$;

acquiring saturation information of the Nth test echo unit signal and the power of an output signal of an analog-to-digital converter (ADC) in the sensor at this moment;

determining a scanning gain based on the saturation information of the Nth test echo unit signal and the power of the output signal of the ADC; and transmitting each scanning unit signal with the scanning gain and/or receiving a scanning echo unit signal corresponding to each scanning unit signal with the scanning gain.

In this embodiment, based on the saturation information of the test echo unit and the power of the ADC output signal, the gain for the RX and/or TX of the detecting signals is adjusted, to ensure the strengths of signals subsequently received by the sensor are within the signal strength range. In this way, signal distortion can be avoided to improve detection accuracy of the sensor, and quantization noise can be avoided to reduce the possibility of malfunction, including missed detection and false detection.

In addition, the method in this embodiment is realized in the digital part of the sensor, which effectively reduces the complexity of circuitry design, increases AGC flexibility, and enables collaboration of RX and TX.

It should be noted that the waveforms of the test unit signal and the scanning unit signal are the same or similar so that the acquired strength of the test echo unit signal can relatively truly reflect the strength of the scanning echo unit signal in RX chain. In some special cases, the waveform of the test unit signal can be set slightly different from that of the scanning unit signal as needed.

In one optional embodiment, the determining a scanning gain based on the saturation information of the Nth test echo unit signal and the power of the output signal of the ADC, includes:

determining whether the transmitting and receiving chain is saturated based on the saturation information of the Nth test echo unit signal;

if it is determined that the transmitting and receiving chain is saturated, setting the scanning gain to a default value;

if it is determined that the transmitting and receiving chain is not saturated, determining the scanning gain based on the power of the output signal of the ADC.

In this embodiment, scanning gain is determined based on the saturation information of the test echo unit signal and the power of the ADC output signal. Specifically, whether the TX and RX chain is saturated is determined based on the saturation information of the Nth test echo unit signal. If the chain is saturated, scanning gain is set to a default value. If the chain is not saturated, scanning gain is determined based on the power of the ADC output signal. In this way, real-time adjustment may be realized based on output signals to ensure that the chain can transmit scanning unit signals or receive the scanning echo unit signals corresponding to each scanning unit signal with the scanning gain, to ensure the transmitted scanning unit signal can detect the object and the received scanning echo unit signal can be used to determine object information, such as distance from the object.

In one optional embodiment, the default value is the minimum or maximum gain of the TX and RX chain.

In this embodiment, when the TX and RX chain is saturated, it is indicated the strength of the received signal is within the range and the detection accuracy is ensured. In this case, the scanning gain for the TX and RX chain can be set to the minimum or maximum value and there is no need to adjust the gain based on the power of the signal.

In an optional embodiment, the method can include:
applying left shifting to the output signal of the ADC if an input signal for the ADC is smaller than a pre-defined value when the default value is the maximum gain for the transmitting and receiving chain.

In an optional embodiment, the determining the scanning gain based on the power of the output signal of the ADC can include:
determining, based on the power of the output signal of the ADC, the scanning gain by looking up a look-up table and/or by calculation.

In one optional embodiment, acquiring the power of the ADC output can include:
determining the power of the output signal of the ADC by calculating an average of squared values in the Nth echo unit signal output by the ADC; or
designating a absolute value of a preset sequence in a valid period of the Nth echo unit signal output by the ADC as the power of the output signal of the ADC.

In one optional embodiment, a largest or a second largest absolute value in the valid period of the Nth echo unit signal output by the ADC is designated as the power of the output signal of the ADC.

In one optional embodiment, the method can further include:
transmitting a 1st test unit signal and receiving a 1st test echo unit signal corresponding to the 1st test unit signal, with an initial gain.

In one optional embodiment, the sensor includes at least two TX and RX chains, and the method further includes:
determining a scanning gain for each transmitting and receiving chain;
where each transmitting and receiving chain transmits and/or receives signals with its own scanning gain; or all transmitting and receiving chains transmit and/or receive signals with a minimum scanning gain.

In this embodiment, for the sensor with at least two TX and RX chains, each chain is independent in terms of AGC. In this case, each TX and RX chain has its own scanning gain. In other words, each TX and RX chain performs object detection with its own scanning gain obtained after its own AGC where angle measurement is not desired. When angle measurement is required, the scanning gains for the TX and RX chains shall be unified before further processing for object detection. That means all TX and RX chains have the same scanning gain (usually the minimum among all the scanning gains for the TX and RX chains) for subsequent object detection, which prevents phase differences from affecting the angle measurement.

Specifically, the final scanning gain can be determined before the transmission of the last test unit signal is finished by the TX and RX chains, or the gain for each TX and RX chain can be kept the same before the decided transmission of each test unit signal is finished, for further AGC.

In one optional embodiment, the method can include:
dividing the signal frame into N test unit signals and at least one scanning unit signal based on the number of unit signals or the frame period the signal frame; or
adding the N test unit signals to an original signal frame to form the signal frame comprising the N test unit signals and at least one scanning unit signal;
wherein N test unit signals are continuous in the frame.

In one optional embodiment, for any signal frame, the N test unit signals are at the beginning of the frame as preamble unit signals;
the transmitting and receiving chain, based on the scanning gain, transmits each scanning unit signal in the signal frame and/or receives a scanning echo unit signal corresponding to each scanning unit signal in the signal frame.

In one optional embodiment, for any signal frame, the N test unit signals are at the end of the frame;
the transmitting and receiving chain, based on the scanning gain, transmits each scanning unit signal in a next signal frame and/or receives a scanning echo unit signals corresponding to each scanning unit signal in the next signal frame.

In one optional embodiment, for any test unit signal, the acquiring the saturation information of the test echo unit signal corresponding to the test unit signal, includes:
counting how many times the transmitting and receiving chain is saturated within a period from start of transmission of the test unit signal to end of receiving of the test unit signal.

In an optional embodiment, the method can include:
determining whether the times exceeds a predefined value;
if the times exceeds the predefined value, determining the transmitting and receiving chain as saturated;
if the times does not exceed the predefined value, determining the transmitting and receiving chain as not saturated.

In one optional embodiment, the method can also include:
determining saturation information of the transmitting and receiving chain when transmitting the scanning unit signal; and
dynamically adjusting the scanning gain based on the saturation information of the transmitting and receiving chain.

It should be noted that when transmitting the scanning unit signals, the TX and RX chain can transmit all the scanning unit signals of the current frame with a fixed scanning gain or transmit the scanning unit signals of the next frame with the fixed scanning gain, or can dynamically adjust the scanning gain in real time based on the acquired saturation information as needed. However, for a single unit signal, only a fixed scanning gain is allowed.

In an optional embodiment, the radio signals are frequency-modulated continuous waves (FMCW).

Since FMCW has a frame structure including continuous unit signals (chirps), the gain setting for the chain can be acquired by using N test unit signals as preamble unit signals for signal strength estimation. Meanwhile, algorithms for AGC are implemented through digital circuits or DSP, which, compared with adding a feedback mechanism on the RF or analog circuits to realize AGC, has greater simultaneity and flexibility of the AGC function, requires simpler circuitry design and can adapt to various scenarios through self-adjustment for the gain of the chain to enable collaboration of transmitting and receiving.

In one optional embodiment, the method can also include:
pre-defining a gain setting table; and determining the (i+1)th preamble gain and/or the scanning gain by looking up the gain setting table;

where each echo unit signal is assigned with a gain setting table or all echo unit signals share a same gain setting table.

In the second aspect, a sensor is provided by this disclosure, including:

a transmitting and receiving chain for transmitting and receiving radio signals;

an ADC for digitally processing the received radio signals; and an AGC module for the AGC of the transmitting and receiving chain according to the method as described in the first aspect.

In an optional embodiment, the sensor can be a mmWave radar sensor.

In an optional embodiment, the AGC module can be a digital circuit module or DSP in the sensor.

In the third aspect, a method for AGC applied in the radio device is provided in this disclosure, including:

acquiring a strength of a signal received by the radio device;

performing digital processing on the strength of the signal received by the radio device, and determining a gain setting of a chain; and transmitting and/or receive signals based on the gain setting of the chain In this embodiment, the corresponding relations between signal strengths and gains can be pre-set. When the strength of a received signal is known, the gain for the TX and RX chain can therefore be determined.

It should be noted that in this embodiment, the method for AGC can refer to what is described in other embodiments of this disclosure in its implementation when there is no conflict and in practical applications adjustments to the technical content of other embodiments can also be made to implement the relevant steps of the method for AGC in this embodiment.

In the fourth aspect, a radio device is provided by this disclosure, including:

TX and RX chain for receiving signals; and an AGC module for implementation of the method to acquire the gain setting of the chain according to any embodiment of the fourth aspect, where the AGC module is also used for transmitting and/or receiving signals with the gain setting.

The radio device in the above-mentioned embodiment can be a communication device or a sensing device for object detection like radar. The radio device, based on the saturation information of the received test signals and the digital processing, adjusts the gain for RX gain of the device, so that the strengths of subsequently received signals for communication and object detection can fall in the range of the RX chain, which creates a fit environment for the transceiver to work and makes relevant modules efficient, simple and flexible.

In the fifth aspect, a sensor is provided by this disclosure. The sensor, when detecting an object in a given time (one or more frames), has two phases, AGC and object detection. In the AGC phase, the sensor can adaptively adjust the gain for TX and RX chain to ensure the echo signals in the object detection phase are in a predefined range. In the whole process of object detection, the two phases work one after another repeatedly.

For example, for FMCW radar, the first some (three or live) chirps of one signal frame are be used as preamble signals for AGC; the rest chirps can be used as scanning signals for object detection. In other words, the phase for transmitting preamble signals of the frame is the AGC phase while the following phase for transmitting scanning signals is the object detection phase. Meanwhile, for continuous frames of signals, the latter chirps of the current frame can be used as preamble signals for AGC for the next frame while using the first chirps of the frames as scanning signals for object detection.

It should be noted that division of the two phases of AGC and object detection can be made based on what the unit signals (chirps) are intended for, or based on the time domain, as needed.

Specifically, the sensor can include:

a transmitting chain for transmitting a radio signal;

a receiving chain for receiving an echo signal; and a detector coupled with the receiving chain, the detector being configured for monitoring whether components are saturated when the receiving chain receives the echo signal; and a controller connected with the transmitting chain, the receiving chain and the detector;

where the controller is configured for adjusting gains for the transmitting chain and/or the receiving chain based on saturation information output by the detector in an AGC phase.

In one optional embodiment, the receiving chain comprises a low noise amplifier LNA, a trans-impedance amplifier TIA, a first variable gain amplifier VGA1, and a second variable gain amplifier VGA2 connected sequentially to process the echo signal;

the detector is connected to an output interface of the TIA, an output interface of the VAG1 and/or an output interface of the VGA2, so as to in real time detect the saturation information of the TEA, the VGA1 and/or the VGA2 in processing the echo signal.

In one optional embodiment, the detector comprises a first detector, a second detector and a third detector, the first detector is connected to the output interface of the TIA, and the first detector is configured to detect and output first saturation information of the TIA in processing the echo signal;

the second detector is connected to the output interface of the VGA1 to detect and output second saturation information of the VGA1 in processing the echo signal; and the third detector is connected to the output interface of the VGA2 to detect and output third saturation information of the VGA2 in processing the echo signal;

the controller is configured to adjust the gains for the transmitting chain and/or the receiving chain based on the first saturation information, the second saturation information and the third saturation information, to realize AGC.

In one optional embodiment, the RX chain also includes:

an ADC connected to the output interface of the VGA2, wherein the ADC is configured for converting the echo signal and outputting ADC data; and the controller is connected to an output interface of the ADC;

when AGC phase is done, the controller is further configured for acquiring current ADC data output by the ADC and current saturation information output by the detector, and acquiring a scanning gain based on the current ADC data and the current saturation information; and in following object detection phase, the controller is further configured for controlling the transmitting chain and/or the receiving chain to transmit and receive radio signals with the scanning gain.

Optionally, each detector includes:

a sampling and comparison module for performing sampling and power comparing on the echo signal;

a counting module for counting how many times signal power sampled by the sampling and comparison module exceeds a pre-defined value; and a comparator for comparing a value output by the counting module with a pre-defined threshold;

before transmission of each unit signal is done in the AGC phase, the comparator outputs saturation information indicating a saturated status if the value output by the counting module is greater than the pre-defined threshold during the transmission.

Optionally, in the AGC phase, the controller acquires an interim gain based on the saturation information output by the detector through table looking up and/or calculation, and set the interim gain as the gain for the transmitting chain and/or the receiving chain to transmit and/or receive a next unit signal.

BRIEF DESCRIPTION OF THE DRAWINGS

For a more complete understanding of the technical solutions in the present disclosure or in prior art, the accompanying drawings to which reference is made to in the following descriptions are briefly described. Obviously, the drawings are only for purpose of illustrating the embodiments described in this disclosure. Those of ordinary skill in the art can acquire other drawings based on the accompanying drawings without creative efforts.

DETAILED DESCRIPTION

Further details of the present disclosure will be described with reference to the drawings and embodiments to make the purpose, features and advantages of this disclosure clear.

For better understanding, all descriptions herein are elaborated with radar as an example. It should be understood that those of ordinary skills in the art can apply what is described in this disclosure to other sensors and communication devices.

In practical applications, strength of the echo signal needs to be set in a pre-defined range to ensure accurate detection performed by the radar since there is an upper and a lower threshold to the strength of the signal that can be properly received by the RX chains of the radar. To do this, the common practice is to add a feedback circuit to the RF/analog circuit so as to adjust the gain for TX and/RX based on the signal output by the feedback circuit. This method, however, not only complicates the circuitry design and lacks flexibility, but also makes it hard for collaboration of the TX and the RX.

In light of this, a method for AGC is provided according to an embodiment of this disclosure, which uses the digital circuit or DSP for AGC. This method makes easier the circuitry design, increases flexibility as adjustments to the gain can be made through digital signals, and enables collaboration of the TX and RX.

For better understanding of the method for AGC, reference to the drawings will be made in the following descriptions.

Figure 1:
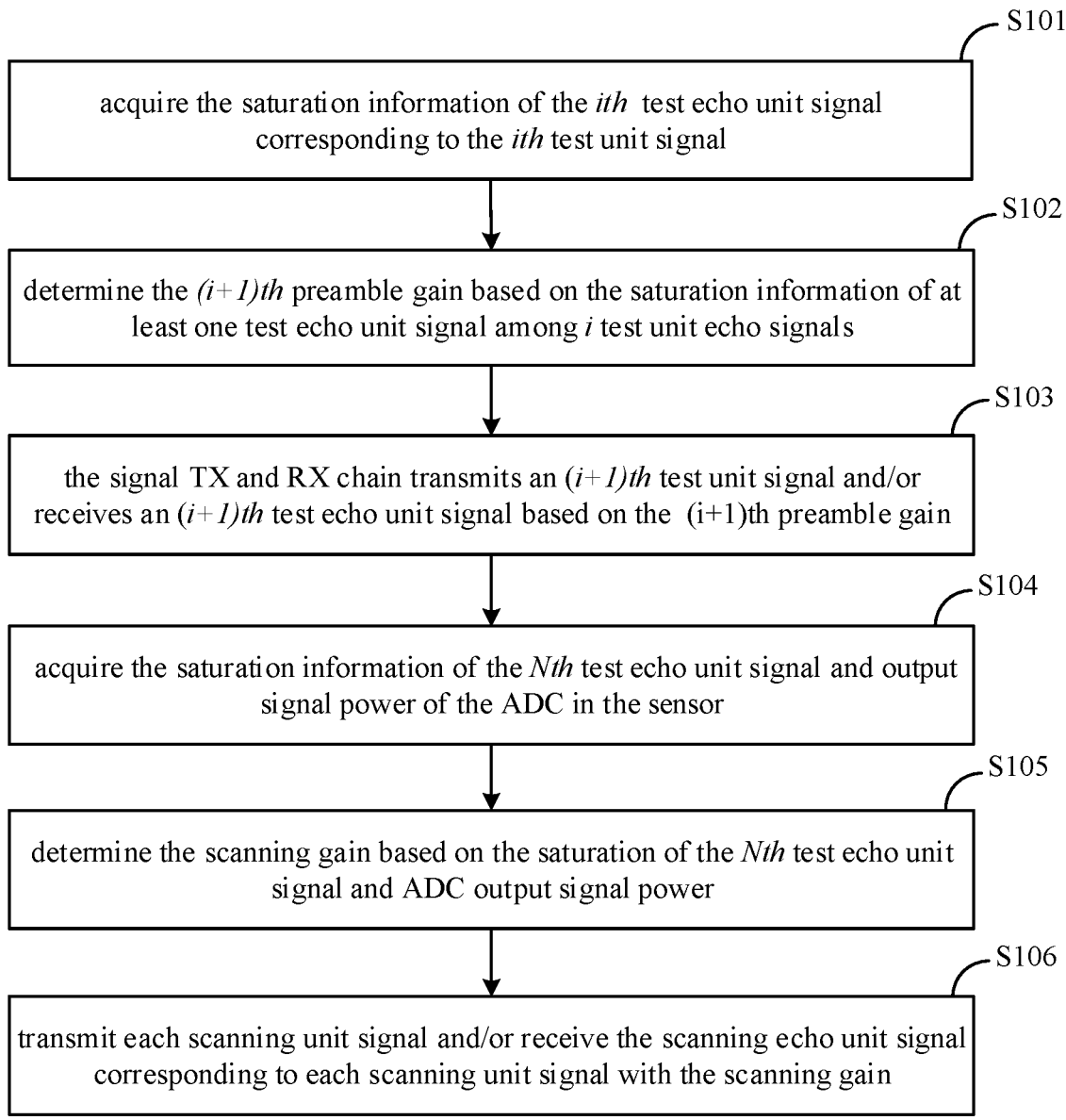
FIG. 1 is a flowchart of a method for AGC provided according to an embodiment of this disclosure.

FIG. 1 is a flowchart of a method for AGC provided according to an embodiment of this disclosure. This method can be applied in the TX and RX chain of sensors or other radio devices. The radio signals transmitted by the TX and RX chain constitute multiple frames, at least some of which include continuous unit signals including N test unit signals and at least one scanning unit signal. The method includes the following steps.

In S101, saturation information of the ith test echo unit signal corresponding to the ith test unit signal.

In this embodiment, saturation information of the test echo unit signal corresponding to each test unit signal transmitted by the TX and RX chain is acquired. The test echo unit signal corresponding to the test unit signal means that the test unit signal is reflected by the object and received by the TX and RX chain. In one optional embodiment, saturation information of the test echo unit signal can be regarded as the signal information of the test echo unit signal beyond receipt for the RX chain.

In addition, saturation information of the test echo unit signal corresponding to ith test unit signal is acquired, including: counting how many times the TX and RX is saturated between the beginning and the end of the transmission of the test unit signal. Specifically, it is determined whether the times of saturation exceed a pre-defined value. If it does, the TX and RX chain is regarded as saturated; otherwise it is not saturated.

Figure 2:
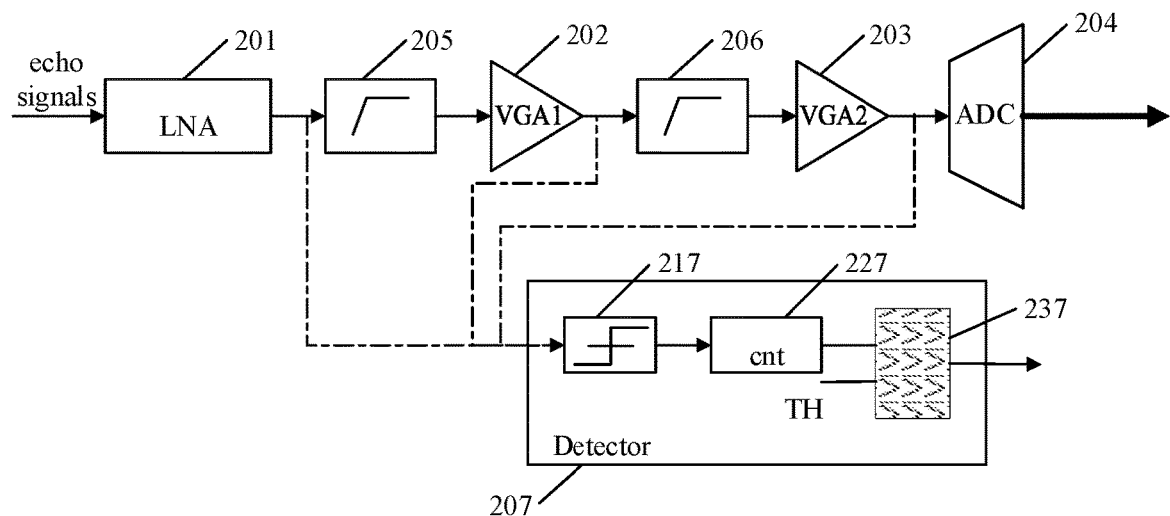
FIG. 2 is a block diagram of test echo unit signal processing provided according to an embodiment of this disclosure.

Specifically, FIG. 2 is a schematic structural diagram of a saturation detector provided for the RX chain. In this embodiment, the RX chain can include a low-noise amplifier LNA 201, variable gain amplifiers VGA1 202 and VGA2 203, and an echo signal sampler ADC 204. Between LNA 201 and VGA1 202 and between VGA1 202 and VGA2 203 there may be a filter 206, 206 as shown in the figure. Between LNA 201 and the filter there can be a transimpedance amplifier TIA (not shown in the figure); accordingly, the detector 207 shown in the figure can be connected to the output interface of LNA 201, TIA, VGA1 202 and/or VGA2 203, to monitor whether LNA 201, TIA, VGA1 202 and/or VGA2 203 are saturated in processing the echo signals in the AGC phase.

In an optional embodiment, one or more detectors can be used to monitor the saturation of each above-mentioned module or some of the modules in the RX chain. For example, Detector 1, Detector 2 and Detector 3 (not shown) can be used to monitor the saturation of each of LNA (or TIA), VGA1 and VGA2. Then saturation statuses output from the three detectors can be collectively used for AGC and the subsequent scanning gain can be acquired based on the saturation statuses together with ADC output data.

Optionally, each above-mentioned detector 207 can include a sampling and comparison module 217, a counting module 227 and a comparator 237, all of which are implemented through digital circuits. The sampling and comparison module 217 is used to sample the echo signals and determine that the component monitored by the detector 207 is saturated when sampling power exceeds a pre-defined power value. The counting module 227 is used to count, based on output of the sampling and comparison module 217, times of saturation within the transmission period of a test unit signal, while the comparator 237 compares the value output by the counting module 227 with a pre-defined count value and reports saturation status of the component monitored by the detector 207 in response to the counted value exceeding the pre-defined count value TH.

In an optional embodiment as shown in FIG. 2, for the TX and RX chain, a saturation detector can be set to count times of saturation as described above in a given time period. For example, a saturation detector is enabled in the transmission period of a test unit signal. The echo signal amplified by LNA is sampled at a designated position in the RX chain and it is determined whether the power of the sampled echo signal exceeds the pre-defined power value. If it does, then the counting module counts one more. The same applies to VGA1 and VGA2. Eventually the value output by the counting module is compared with the pre-defined count value. If the value output by the counting module is no smaller than the pre-defined count value, the RX is deemed saturated in receiving the echo signal.

In one optional embodiment, one signal frame including N test unit signals and at least one scanning unit signal can be acquired through the following methods.

The first method is based on supposing M scanning unit signals in a single frame. N test unit signals as preamble signals are added before M scanning unit signals. Then a signal frame should include N+M unit signals, namely the N test unit signals and M scanning unit signals, and is transmitted in a continuous manner. The type of the added N test unit signals can be the same as or different from that of M scanning unit signals. For example, the added test unit signals and scanning unit signals can share the same parameters, while the values of M and N can flexible as needed, which is not limited in this embodiment. In addition, in consideration of radar application scenarios, the following condition should be met: $2 \leq N \leq M+N/2$, and M, N$\in$Z.

The second method is based on the number of unit signals. The unit signals in one signal frame are divided in to N test unit signals and at least one scanning unit signal. For example, a signal frame including X unit signals is acquired, wherein first X1 unit signals are defined as test unit signals and rest X2 unit signals as scanning unit signals. In consideration of radar application scenarios, the following condition should be met: $2 \leq X1 \leq X/2$, $2 \leq X2$, and X, X1, X2$\in$Z.

The third method is to divide the unit signals in a signal frame into test unit signals and scanning unit signals based on the frame period. For example, suppose the period of a frame is T. The unit signals in the T1 period are defined as test unit signals, and the unit signals in the rest T2 period are defined as scanning unit signals. $T=T1+T2$, $2 \leq T1 \leq T/2$, and there should be at least two unit signals in T1 or T2, In other words, by dividing the frame period the test unit signals and the scanning unit signals can be determined. As an example, the unit signals in the early period are defined as test unit signals and the unit signals in later period are defined as scanning unit signals.

In this embodiment, test unit signals for the gain estimation are usually not used for object detection and they have the same or similar waveform with those used for object detection so that the acquired strength of the test unit signal for the gain estimation can relatively truly reflect the strength of the scanning test unit signal for object detection in the RX chain.

Understandably, based on the above-mentioned signal frame including test unit signals and scanning unit signals, it is determined whether the ith test echo unit signal is saturated.

The controller can determine whether the ith test echo unit signal is a saturation signal with the following method: the controller sampling the ith test echo unit signal several times to acquire several sampling points in a given valid time; determining saturation status of the chain for each sampling point; if the chain is saturated for all sampling points or more points than a pre-defined value, the ith test echo unit signal is regarded as saturation signal. Specifically, whether the sampling power for each sampling point exceeds the threshold power is determined. If it does, the chain is determined as saturated for the sampling point. The number of sampling points where saturation happens is counted. If the number exceeds the pre-defined value, the ith test echo unit signal is deemed as saturation signal.

When i=1, that is transmitting the first test unit signal, the TX and RX chain can transmit the first test unit signal and receive the first test echo signal with an initial gain. The initial gain includes an initial transmission gain and an initial receiving gain and can be pre-set by the radar system based on the application scenario and data analysis.

In S102, the (i+1)th preamble gain is determined based on the saturation information of at least one test echo unit signal among previous i test unit echo signals.

In this embodiment, the controller acquires the saturation information of the test echo unit signals corresponding to the currently transmitted test unit signals, and determines the (i+1)th preamble gain based on the saturation information of at least one test echo unit signal among all test unit echo signals.

The methods for the controller to determine the (i+1)th preamble gain based on the saturation information of at least one test echo unit signal among previous i test unit echo signals may be as follows.

Method 1: The controller chooses some test echo unit signals among all i test echo unit signals and determines the (i+1)th preamble gain based on the saturation information of the chosen test echo unit signals through calculation and/or table looking up. Or, the controller acquires the saturation information of some test echo unit signals to determine their corresponding preamble gains. That is, the controller presets a look-up table (LTU) of saturation information and corresponding preamble gains, and after acquiring the saturation information of i test unit echo signals, it determines the preamble gain of some test echo unit signals by looking up the LUT based on their saturation information.

Method 2: The controller determines the (i+1)th preamble, gain based on the saturation information of all test echo unit signals through calculation or table looking up. That is, the controller, after acquiring the saturation information of the ith test unit echo signal, determines the (i+1)th preamble gain based on the saturation information of the previous test echo unit signals and current test echo unit signal. Specifically, the controller can acquire the saturation information of all test echo unit signals to calculate the (i+1)th preamble gain. Or, the controller can acquire the saturation information of all test echo unit signals to determine the (i+1)th preamble gain by looking up the LUT.

In some embodiments, the controller pre-sets a LUT of gains, according to which the (i+1)th preamble gain is determined. Specifically, each echo unit signal has a LUT, or all echo unit signal share the same LUT.

In actual implementation, the controller can calculate the average saturation information based on the saturation information of all test echo unit signals, and then determine the (i+1)th preamble gain by calculation or looking up the LUT, The controller can also acquire the maximum saturation and minimum saturation among the saturation information of all test echo unit signals, based on which the (i+1)th preamble gain is determined by through calculation, or looking up the LUT. The calculation of the preamble gain can be performed by the controller by determining the preamble gain based on the saturation of the test echo unit signals and the maximum test echo unit signal that can be received by the TX and RX chain.

In S103, the signal TX and RX chain transmits an (i+1)th test unit signal and/or receives an (i+1)th test echo unit signal based on the (i+1)th preamble gain; sequentially circulating until i is equal to N−1.

In this embodiment, the (i+1)th test unit signal is transmitted with the (i+1)th preamble gain and/or the (i+1)th test echo unit signal is received with the (i+1)th preamble gain. That is, the preamble gain for the next test unit signal transmission and/or next echo unit signal receiving is determined at the present moment. Sequentially circulating S102 and S103 until the (N−1)th preamble gain is used for transmitting the Nth test unit signal and receiving the Nth test echo unit signal.

In practical applications, adjusting the gain for the TX and RX chain can include adjusting the gain for the TX only, adjusting the gain for the RX only, adjusting the gains for both TX and RX at the same time, or adjusting the gain for the RX first and subsequently adjusting the gain for the TX. When the gain for TX and that for RX are adjusted separately, adjusting the gain for the RX chain is preferred over adjusting the gain for the TX chain.

Optionally, when both the TX and the RX are adjusted in the gain, the (i+1)th preamble gain can be used for receiving the (i+1)th test echo unit signal; sequentially circulating until i=N1. (N1+1)th preamble gain can be used for transmitting the (N1+2)th test unit signal; sequentially circulating until i=N−1. Then the saturation information of Nth test echo unit signal can be acquired. That is, using the gain adjusted based on saturation information of previous N1 test echo unit signals for the RX to receive the test echo unit signal; using the gain adjusted based on the saturation information of echo unit signals between the (N1+1)th and (N−1)th test echo unit signals for the TX to transmit the next test unit signal, where N1∈Z, 2<N1<N−1.

In S104, the saturation information of the Nth test echo unit signal and power of the ADC output signal in the sensor are acquired.

Specifically, after the Nth test unit signal is transmitted with the (N−1)th preamble gain, the saturation information of the Nth test echo unit signal corresponding to the Nth test unit signal is acquired; at the same time the power of ADC output signal for the Nth test echo unit signal is acquired.

In S105, the scanning gain is determined based on the saturation of the Nth test echo unit signal and power of the ADC output signal.

Specifically, whether the TX and RX chain is saturated is determined based on the saturation information of the Nth test echo unit signal. If it is saturated, the scanning gain can be set to the default value. That means, when the TX and RX chain is saturated, the strengths of the test echo unit signals received by the RX chain are not proper for object detection, which requires adjustment for the scanning gain. The scanning gain for the TX and/or the RX need be set to the default value that can either be the maximum scanning gain or the minimum scanning gain.

In some embodiments, to ensure detection accuracy, right or left shifting can be applied to the signals output by the ADC, and the scanning gain is determined based on output power of the shifted signals. For example, when the scanning gain for the TX and RX is already the maximum gain and the strengths of the echo unit signals are still weak, then left shifting can be applied to the signals output by the ADC to enhance the output power, which ensures detection accuracy.

In addition, when the TX and RX chain is not determined as saturated based on the saturation information of the Nth test echo unit signal, the scanning gain can be determined based on the power of the ADC output signal. Specifically, the controller, after acquiring the power of the ADC output signal for the Nth test echo unit signal, can calculate the scanning gain, based on the signal strength range (maximum and minimum values) of the TX and RX chain and the output power, to ensure the strengths of the echo unit signals do not exceed the maximum value nor go below the minimum value, as to ensure detection accuracy. Alternatively, the controller, after acquiring the power of the output signal for the Nth test echo unit signal, can determined scanning gain by looking up the LUT. With the scanning gain, the scanning unit signal is transmitter or the scanning echo unit signal is received so that the strength of the received scan echo unit signal does not exceed the maximum value nor go below the minimum value, to ensure subsequent detection accuracy.

In some embodiments, the controller pre-stores the LUT of gains and the scanning gain is determined by looking up the LUT, which improves system efficiency Specifically, each test echo unit signal has a LUT of gains or all test echo unit signals share the same LUT of gains. In some embodiment, the methods to acquire the power of the ADC output signal are as follows.

Method 1. The power of the ADC output signal is determined by calculating the average of the square of each value in the Nth test echo unit signal. That is to sample the Nth test echo unit signal to acquire the amplitude of each sampling point. The power of the ADC output signal is calculated by summing squares of the amplitudes of the sampling points and then getting divided by the number of sampling points.

Figure 3:
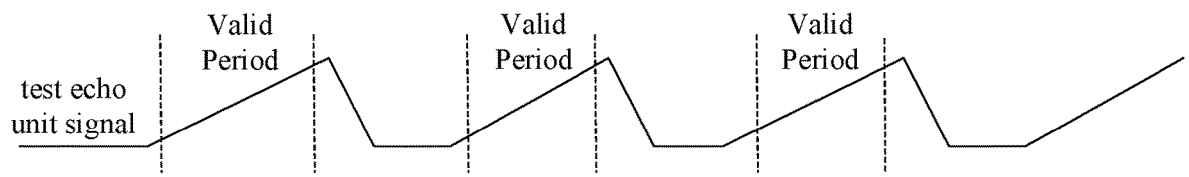
FIG. 3 is a schematic of a valid period of a frame provided according to an embodiment of this disclosure.

Method 2: The absolute value of the pre-set sequence in the valid period of the Nth test echo unit signal output by the ADC is designated as the power of the ADC output signal. That is, for the acquired Nth test echo unit signal, its valid period shall be determined first. As shown in FIG. 3, when the chirp ramps up with a valid rising edge, part or all of a period between the rising edge and the falling edge can be determined as valid period. The absolute value corresponding to some sampling points in the valid period is determined as the power of the ADC output signal. The absolute value of the pre-set sequence can be the maximum or the second maximum. In other words, the square of the maximum or the second maximum in the valid period is used as the power of the ADC output signal.

In S106, each scanning unit signal is transmitted with the scanning gain and/or the scanning echo unit signal corresponding to each scanning unit signal is received with the scanning gain.

In this embodiment, after the scanning gain is determined based on the saturation information of the Nth echo unit signal and the power of the ADC output signal, the subsequent scanning unit signals can be transmitted with the gain and/or the scanning echo unit signals corresponding to the scanning unit signals can be received with the gain. The scanning gain can include the transmission gain and/or receiving gain. When there is only transmission gain in the scanning gain, the TX transmits each scanning unit signal with the transmission gain. When there is only receiving gain in the scanning gain, the RX receives the scanning echo unit signal corresponding to each scanning unit signal with the receiving gain. When there are both transmission gain and receiving gain in the scanning gain, the TX transmits each scanning unit signal with the transmission gain and the RX receives the scanning echo unit signal corresponding to each scanning unit signal with the receiving gain.

In some optional embodiments, the saturation information of each TX and RX chain can be acquired in the transmission of each scanning unit signals, so that the scanning gain can be adjusted dynamically based on the saturation information of each TX and RX chain to further make the TX and RX chain can dynamically adjust the strength of the received scanning echo unit signal for detection accuracy in locating the object. The acquisition of saturation information of each TX and RX chain can refer to above descriptions about acquiring the saturation information of the test echo unit signal.

In some embodiments, when the sensor includes at least two TX and RX chains, the scanning gain tiff each chain is determined. With its own scanning gain, each TX and RX chain transmits the scanning unit signal and/or receives the scanning echo unit signal corresponding to each scanning unit signal. In other words, each TX and RX chain determines its own scanning gain independently, with which the chain transmits the scanning unit signal or receives the scanning echo unit signal corresponding to each scanning unit signal.

In some embodiments, when the sensor includes at least two TX and RX chains and also works for angle measurement, the scanning gains for different chains are the same, That is, when the sensor is used for both range detection and angle measurement, the TX and RX chains have a same object scanning gain to transmit the scanning unit signal and/or receive the scanning echo unit signal corresponding to each scanning unit signal. Angle measurement refers to measure, by the sensor, the deflection angle of the object from the sensor. The object gain can be determined based on the scanning gain corresponding to each TX and RX chain. For example, the minimum among all the scanning gains for the TX and RX chains is determined as the object gain so that the strengths of the scanning echo unit signals received by the TX and RX chains are in the range.

In this embodiment, when the sensor includes at least two TX and RX chains, each chain is independent in terms of AGC. In this case, each TX and RX chain has its own scanning gain. In other words, each TX and RX chain performs object detection with its own scanning gain obtained after its own AGC where angle measurement is not desired. When angle measurement is required, the scanning gains for the TX and RX chains shall be unified before further processing for object detection. That means all TX and RX chains have the same scanning gain (usually the minimum among all the scanning gains for the TX and RX chains) for subsequent object detection, which prevents phase differences from affecting the angle measurement.

Specifically, the final scanning gain can be determined before the transmission of the last test unit signal is finished by the TX and RX chains, or the gain for each TX and RX chain can be kept the same before the decided transmission of each test unit signal is finished, for further AGC.

Figure 4A:
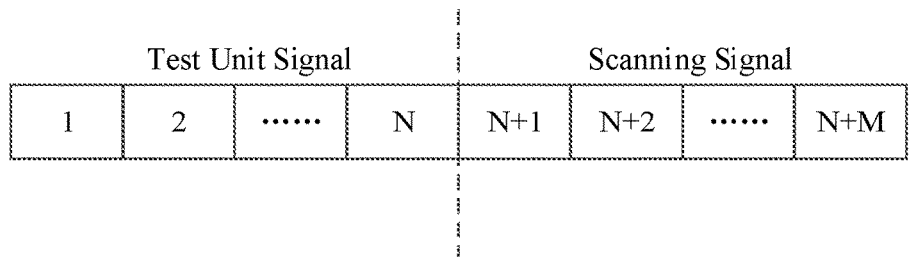
FIG. 4a is a schematic of a signal transmission structure provided according to an embodiment of this disclosure.

In some embodiments, for a signal frame, N test echo unit signals in the front of the frame form preamble unit signals. The TX and RX chain, with the scanning gain, transmits each scanning unit signal in the frame and/or receives the scanning echo unit signal corresponding to each scanning unit signal in the frame. As shown in FIG. 4a, the signal frame includes N test unit signals and M scanning unit signals. The N test unit signals as preamble unit signals of the frame come before the M scanning unit signals. The N+M unit signals are continuous.

Figure 4B:
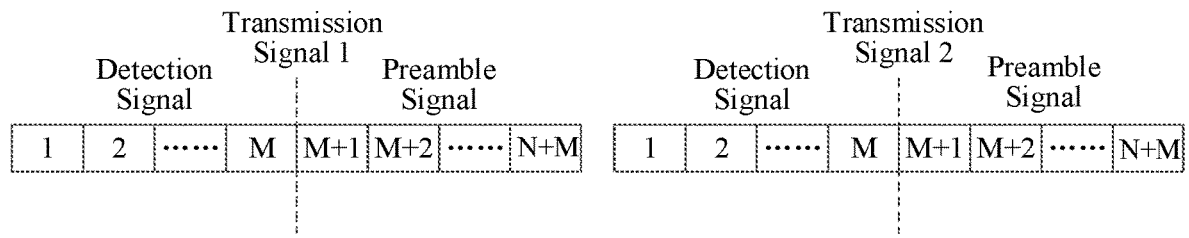
FIG. 4b is a schematic of another signal transmission structure provided according to an embodiment of this disclosure.

In some embodiments, for a signal frame, N test unit signals are at the end of the frame. The TX and RX chain, with the scanning gain, transmits each scanning unit signal in a next frame and/or receives the scanning echo unit signal corresponding to each scanning unit signal in the next frame. As shown in FIG. 4b, Frame 1 (transmitting signal 1) includes M scanning unit signals and N test unit signals. The N test unit signals as preamble signals for the next frame come after the M scanning unit signals. In this case, the scanning gain determined based on the Nth test echo unit signals is used for the TX and RX chain to receive the scanning echo test unit signals corresponding to the scanning unit signals in Frame 2 (transmitting signal 2) and/or transmit the scanning unit signals in Frame 2.

It can be understood that, wherever the test unit signal is, it can be used to estimate the signal strength for gain adjustment of the TX and RX chain, so that the strengths of the received test echo unit signals are within the pre-set range to ensure detection accuracy.

In this embodiment, saturation information of test echo signals corresponding to the test unit signals currently transmitted is acquired, and the preamble gain is determined based on the saturation information of at least one received test echo unit signal. With the preamble gain, the next test unit signal is transmitted and/or the test echo unit signal corresponding to the next test unit signal is received. When the next test unit signal is transmitted, the saturation information of the test echo unit signal corresponding to it is acquired, based on which the preamble gain is determined for the transmission of a test unit signal after the next test unit signal and/or the receiving of the corresponding test echo unit signal. Circulating until the (N−1)th test unit signal. When the Nth test unit signal is transmitted, the saturation information of the corresponding test echo unit signal and the power of the ADC output signal for the test echo unit signal are acquired, based on which the scanning gain is determined for the transmission of the scanning unit signal a and/or the receiving of the corresponding scanning echo unit signal. By implementing the method provided by this disclosure, the real-time gain for the TX and RX chain can be determined to adjust transmission power for the transmitting signals and/or receiving power for the echo signals so that the strengths of the echo signals are within the pre-set range to be received, which improves accuracy for object detection.

In this embodiment, based on the saturation information of the test echo unit and the power of the ADC output signal, the gain of chain for the RX and/or TX of detection signals is adjusted, to ensure that the strengths of received signals are within the pre-set strength range. In this way, signal distortion can be avoided to improve detection accuracy, and quantization noise can be avoided to reduce the possibility of malfunction, including missed detection and false detection. In addition, the method in this embodiment is realized digitally in the sensor, which effectively reduces the complexity of circuitry design, increases AGC flexibility, and enables collaboration of RX and TX in the sensor.

Figure 5A:
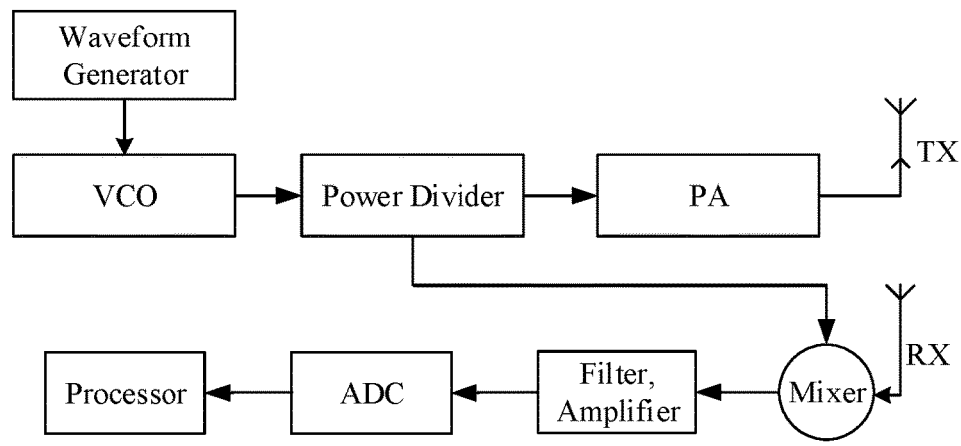
FIG. 5a is a block diagram of a radar system provided according to an embodiment of this disclosure.

This disclosure also applies to frequency-modulated continuous wave (FMCW) radar. For example:

A radar system as shown in FIG. 5a can include a radio frequency RF front-end including transmitting antennas, receiving antennas, a divider, power amplifiers and a mixer, and back-end part including a triangular wave generator, a voltage controlled oscillator (VCO), ADCs and a signal processing module. Specifically, a modulated signal, output from the triangular wave generator, is passed to the VCO to generate a continuous high-frequency constant-amplitude wave whose frequency varies in a triangle from in time. The wave, divided by the divider, is partly transmitted by the transmitting antennas after being amplified by the power amplifier and partly used as local oscillating signals for the mixer. The transmitted signals, reflected by the object, will be received by the receiving antennas as the echo signals, which may be different from the local oscillating signals in frequency and phase. The mixed down beat signals output by the mixer based on the local oscillating signal, after being filtered and amplified, and ADC sampled, goes through digital processing such as 2-dimensional fast Fourier transform (2D FFT), constant false alarm rate (CFAR) and direction of arrival (DoA) estimation, to acquire object information of distance from the sensor, velocity and angle, and in turn realize object detection.

FMCW has a frame structure including multiple chirps. With the method for AGC provided by this disclosure, the gain setting for the chain can be acquired by processing the strengths of reflected chirps in the digital part. With the gain setting for the chain, the strengths of the transmitted chirps and/or echo chirps can be adaptively adjusted to ensure the strengths of the echo chirps are received within the pre-set range for detection accuracy.

Figure 5B:
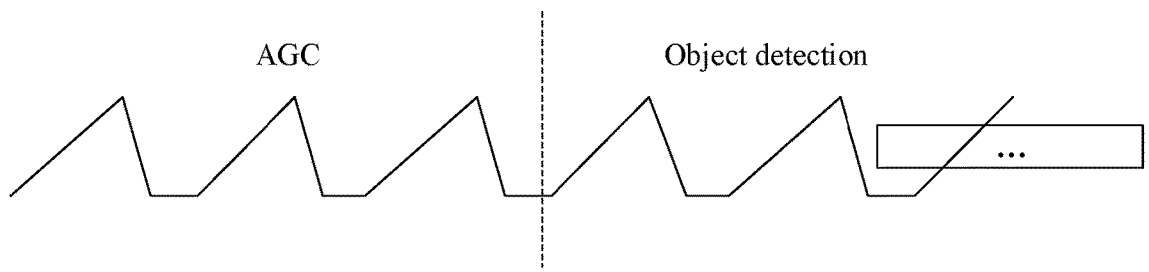
FIG. 5b is schematic of a frequency-modulated continuous wave provided according to an embodiment of this disclosure.

In practical applications, the gain for the TX/RX chain can be acquired by estimating the strengths of a given number of chirps in a signal frame of a frequency-modulated continuous waveform. As shown in FMCW of FIG. 5b, chirps left to the dashed line are for strength estimation for AGC while chirps right to the line are for object detection. It should be noted that the linear waveform in the figure is just one exemplary form of FMCW. In real cases, it can be set otherwise as needed.

It should be noted that chirps for strength estimation are usually not used for object detection and they have the same or similar waveform with those used for object detection so that the acquired strengths of the chirps for the strength estimation can relatively truly reflect the strengths of the chirps for object detection in the TX and RX chain.

Figure 6:
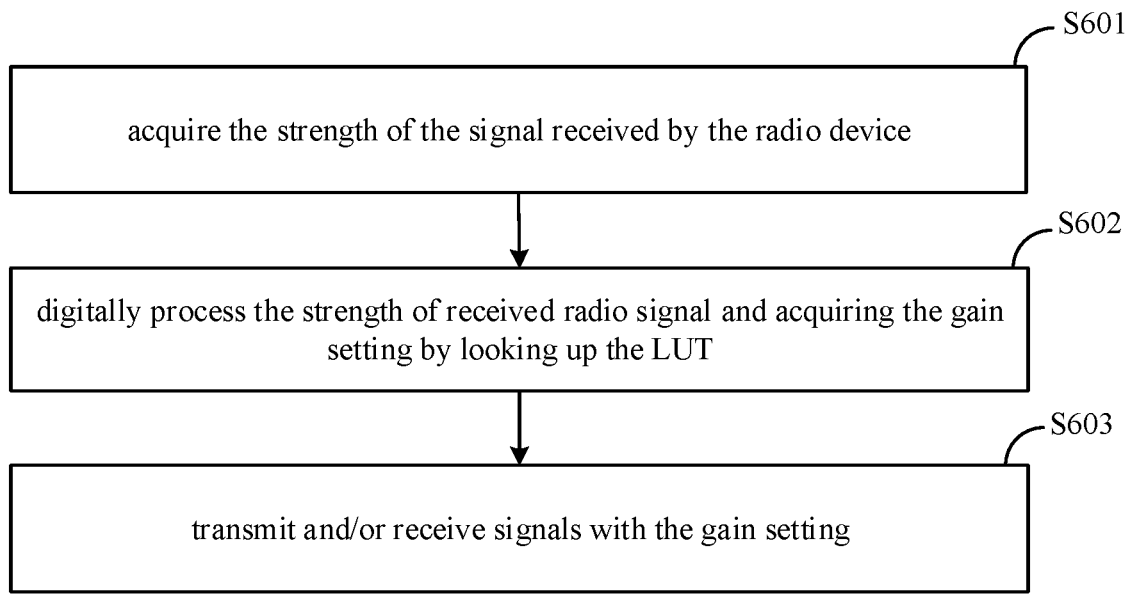
FIG. 6 is a flowchart of another method for AGC provided according to an embodiment of this disclosure.

In addition, another method for AGC is provided by this disclosure. FIG. 6 is a flowchart of the method for AGC according to an embodiment of the disclosure. The method includes the following steps.

In S601, the strength of the signal received by the radio device is acquired.

In S602, the received signal is digitally processed and the gain setting for the chain is acquired by looking up the LUT.

In this embodiment, digitally processing the signal received by the radio device includes filtering the noise in the signal. Then the strength of the processed signal is acquired for determining the gain setting for the chain by looking up the LUT.

In S603, signals are transmitted and/or received with the gain setting.

Once the gain setting for the chain is determined, the TX and RX chain can transmit or receive signals with the gain setting so that the strengths of the echo signals received by the radio device meet a pre-set condition, which ensures detection accuracy.

Figure 7:
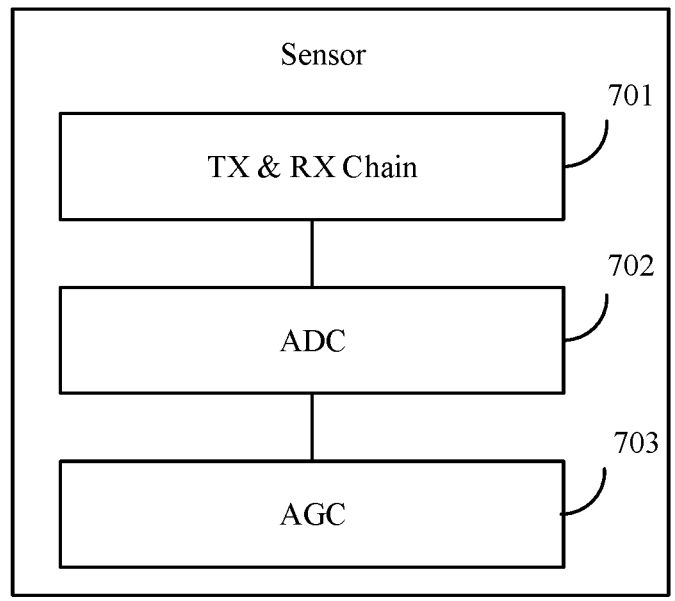
FIG. 7 is a schematic structural diagram of a sensor provided according to an embodiment of this disclosure.

In line with the method, a sensor is further provided by this disclosure. As shown in FIG. 7, the sensor 700 can include a TX and RX Chain 701, an ADC 702 and an AGC Module 703.

The TX and RX Chain 701 is configured to transmit and receive radio signals. Realization of the chain 701 can refer to descriptions about the method in in FIG. 1.

The ADC 702 is configured to digitally process the received radio signals. Specifically, the ADC digitally processes the received test echo unit signal or scanning echo unit signal. Realization of the ADC 702 can refer to descriptions about the method in in FIG. 1.

The AGC Module 703 is configured to control the gain for the TX and RX chain in accordance with the method in the embodiments (FIG. 1 and FIG. 6) provided by this disclosure. Realization of the AGC module 703 can refer to relevant descriptions mentioned before. The AGC Module 703 can be a digital circuit or a digital signal processor in the sensor.

Figure 8:
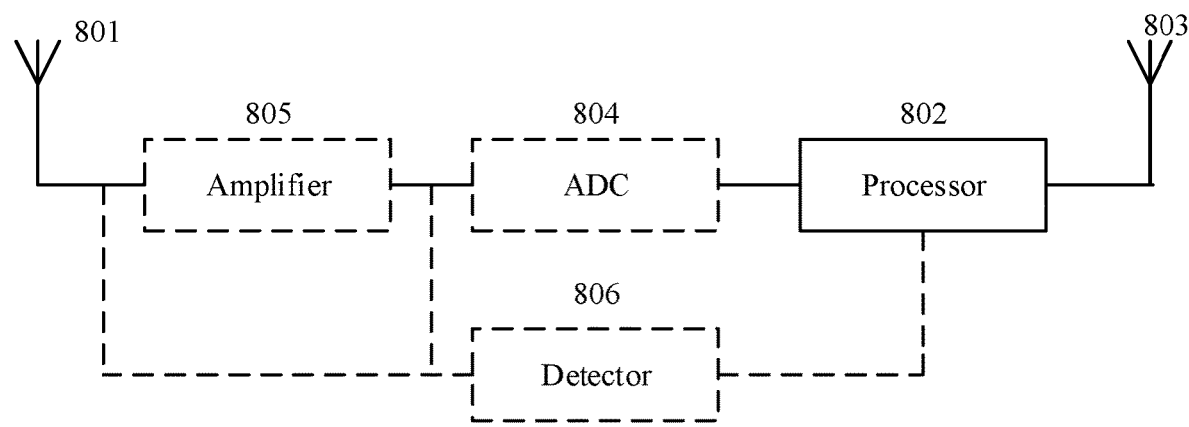
FIG. 8 is a schematic structural of another sensor provided according to an embodiment of this disclosure.

The sensor can be mmWave radar and can include, as shown in FIG. 8, a receiving antenna 801, a processor 802 and a transmitting antenna 803. The processor 802 is connected to the receiving antenna 801 and the transmitting antenna 803.

Receiving Antenna 801 is configured to receive test echo unit signals or scanning echo unit signals.

The processor 802 is configured to acquire the strengths of the test echo unit signals and digitally process the strengths to acquire the gain for the chain.

The transmitting antenna 803 is configured to transmit subsequent test unit signals or scanning unit signals with the gain.

The receiving antenna 801 is further configured to receive the test echo unit signals corresponding to the subsequent test unit signals or the scanning echo unit signals corresponding to the scanning unit signals with the gain.

In some embodiments, the radar also includes: an ADC 804 between receiving antenna 801 and the processor 802 for performing analog-to-digital conversion for test echo unit signals.

In this embodiment, the ADC performs analog-to-digital conversion for the test echo unit signals received by the receiving antenna and outputs the converted test echo unit signals for the processor to acquire the strengths of the test echo unit signals. In other words, through ADC conversion, the strengths of digital test echo unit signals are acquired, which simplifies the process.

In some embodiments, the radar further includes an amplifier 805 between the receiving antenna 801 and the processor 802, and specifically, between the receiving antenna 801 and the ADC 804. The amplifier 805 is configured to amplify the test echo unit signals.

In some embodiments, the radar further includes a detector 806 to determine whether a test echo unit signal is saturated based on the power of the echo signal at each sampling point.

Specifically, the detector 806 includes a comparator and a counting module. The comparator is for comparing the signal power at each sampling point with a pre-defined value. The counting module is for counting the number of the sample points at which the signal power exceeds the pre-defined value.

The realization of each module can refer to the method 100 described above and will not be repeated here.

Figure 9:
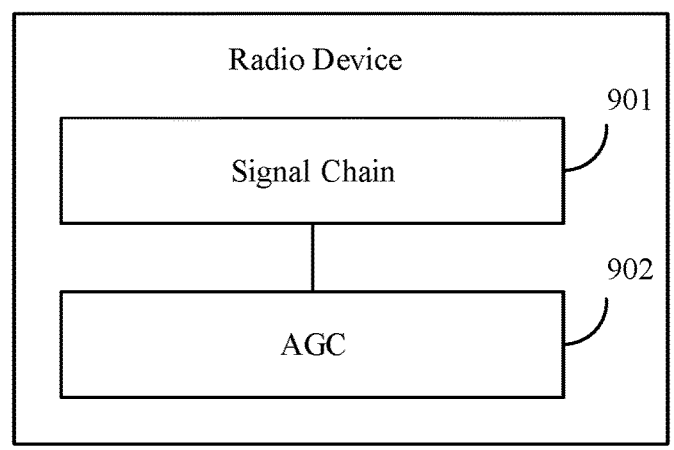
FIG. 9 is a block diagram of a radio device provided according to an embodiment of this disclosure.

This disclosure further provides a radio device. As shown in FIG. 9, the Radio Device 900 can include a Chain 901 and an AGC Module 902.

The Chain 901 is configured to transmit and receive signals.

The AGC Module 902 is configured to acquire the gain setting for the Chain so as to transmit and/or receive signals according to the gain setting.

The realization of the Chain 901 and AGC Module 902 can refer to relevant descriptions previously mentioned.

It should be noted that the embodiments herein are described in a progressive way, each of which emphasizes the differences from others, and the same or similar contents of the embodiments may be referred to each other. The description of the system or device embodiment is simple because it corresponds to the method embodiment and the method embodiment may be referred to for better understanding of the system or device embodiment.

It should be noted that in this disclosure, "at least one" means one or more; "some" means two or more, "and/or" is used to describe the association of two objects and includes three conditions. For example, "A and/or B" means: 1. only A; 2. only B; 3. both A and B, wherein A and B can be singular or plural. "I" is usually used to denote the "or" association of the former and latter objects. "at least one of (items)" or similar expressions mean the random combination of the items, including singular or plural items. For example, "at least one of a, b or c" means "a", "b", "c", "a and b", "a and c", "b and c", or "a and h and c", wherein a, h and c can be singular or plural.

It should be noted that in this disclosure, conjunctive words like first and second are merely used to separate one entity or operation from another entity or operation, and do not require or imply any relationship or sequence. The terms "comprises (comprising)", "includes (including)" or any other variation thereof, are intended to cover a non-exclusive inclusion, such that a process, method, article, or apparatus that comprises a list of elements does not include only those elements but may include other elements not expressly listed or inherent to such process, method, article, or apparatus, Unless otherwise limited, an element proceeded by "comprises a . . ." does not preclude the existence of additional identical elements in the process, method, article, or apparatus that comprises the element.

The method or algorithm steps in this disclosure can be implemented in hardware or software modules executed by the processor, or a combination thereof. The software modules may reside in a Random Access Memory (RAM), a memory, a Read Only Memory (ROM), an Electrically Programmable ROM, an Electrically-Erasable Programmable ROM, a register, a hard disk, a removable disk drive, CD-ROM, or other types of storage media well known in the field.

The foregoing description of the disclosed embodiments enables those of skill in the art to implement or use the present application, A variety of modifications to these embodiments will be apparent to those skilled in the art, and the general principles defined herein can be implemented in other embodiments without departing from the spirit or scope of the present application. The present application is not intended to be limited to the embodiments shown, but is to be accorded the widest possible scope consistent with the principles and features disclosed herein.

The invention claimed is:

1. A method for automatic gain control (AGC), applicable in a transmitting and receiving chain of a sensor, wherein a radio signal frame transmitted on the transmitting and receiving chain comprises a plurality of continuous unit signals, the plurality of unit signals comprise N test unit signals and at least one scanning unit signal, and the method comprises:
    acquiring saturation information of an ith test echo unit signal corresponding to an ith test unit signal, wherein i and N are positive integers, i≤N−1 and 2≤N;
    determining an (i+1)th preamble gain according to the saturation information of at least one test echo unit signal in first i test echo unit signals;
    transmitting, by the transmitting and receiving chain, an (i+1)th test unit signal based on the (i+1)th preamble gain and/or receiving, by the transmitting and receiving chain, an (i+1)th test echo unit signal based on the (i+1)th preamble gain;
    sequentially circulating until i is equal to N−1;
    acquiring saturation information of an Nth test echo unit signal and a power of an output signal of an analog-to-digital converter (ADC) in the sensor at this moment;
    determining a scanning gain based on the saturation information of the Nth test echo unit signal and the power of the output signal of the ADC; and
    transmitting the at least one scanning unit signal with the scanning gain and/or receiving a scanning echo unit signal corresponding to the at least one scanning unit signal with the scanning gain.

2. The method of claim 1, wherein the determining a scanning gain based on the saturation information of the Nth test echo unit signal and the power of the output signal of the ADC, comprises:
    determining whether the transmitting and receiving chain is saturated based on the saturation information of the Nth test echo unit signal;
    if it is determined that the transmitting and receiving chain is saturated, setting the scanning gain to a default value; and
    if it is determined that the transmitting and receiving chain is not saturated, determining the scanning gain based on the power of the output signal of the ADC.

3. The method of claim 2, wherein the default value is a minimum or maximum gain for the transmitting and receiving chain.

4. The method of claim 3, further comprising:
    applying left shifting to the output signal of the ADC if an input signal for the ADC is smaller than a pre-defined value when the default value is the maximum gain for the transmitting and receiving chain.

5. The method of claim 2, wherein the determining the scanning gain based on the power of the output signal of the ADC, comprises:
    determining, based on the power of the output signal of the ADC, the scanning gain by looking up a look-up table and/or by calculation.

6. The method of claim 1, wherein the acquiring the power of the output signal of the ADC comprises:
    determining the power of the output signal of the ADC by calculating an average of squared values in the Nth echo unit signal output by the ADC; or designating a absolute value of a preset sequence in a valid period of the Nth echo unit signal output by the ADC as the power of the output signal of the ADC, wherein a largest or a second largest absolute value in the valid period of the Nth echo unit signal output by the ADC is designated as the power of the output signal of the ADC.

7. The method of claim 1, wherein the sensor comprises at least two transmitting and receiving chains, and the method further comprises:
determining a scanning gain for each transmitting and receiving chain;
wherein each transmitting and receiving chain transmits and/or receives signals with its own scanning gain; or all transmitting and receiving chains transmit and/or receive signals with a minimum scanning gain.

8. The method of claim 1, further comprising:
dividing the signal frame into the N test unit signals and the at least one scanning unit signal based on the number of unit signals or a frame period of the signal frame; or
adding the N test unit signals to an original signal frame to form the signal frame comprising the N test unit signals and the at least one scanning unit signal;
wherein the N test unit signals are continuous in the signal frame.

9. The method of claim 1, wherein for any signal frame, the N test unit signals are at beginning of the signal frame as preamble unit signals;
the transmitting and receiving chain, based on the scanning gain, transmits the at least one scanning unit signal in the signal frame and/or receives a scanning echo unit signal corresponding to the at least one scanning unit signal in the signal frame.

10. The method of claim 1, wherein for any signal frame, the N test unit signals are at end of the signal frame;
the transmitting and receiving chain, based on the scanning gain, transmits each scanning unit signal in a next signal frame and/or receives a scanning echo unit signals corresponding to each scanning unit signal in the next signal frame.

11. The method of claim 1, wherein for any test unit signal, the acquiring the saturation information of the test echo unit signal corresponding to the test unit signal, comprises:
counting how many times the transmitting and receiving chain is saturated within a period from start of transmission of the test unit signal to end of receiving of the test unit signal;
determining whether the times exceeds a predefined value;
if the times exceeds the predefined value, determining the transmitting and receiving chain as saturated;
if the times does not exceed the predefined value, determining the transmitting and receiving chain as not saturated.

12. The method of claim 1, further comprising:
pre-defining a gain setting table; and
determining the (i+1)th preamble gain and/or the scanning gain by looking up the gain setting table;
wherein each echo unit signal is assigned with a gain setting table or all echo unit signals share a same gain setting table.

13. A sensor, comprising:
a transmitting and receiving chain for transmitting and receiving radio signals;
an ADC for digital processing of received radio signals; and
an AGC module for implementing AGC for the transmitting and receiving chain according to claim 1.

14. The sensor of claim 13, wherein the sensor is millimeter-wave radar.

15. The sensor of claim 13, wherein the AGC module is a digital circuit module or a digital signal processor in the sensor.

16. A sensor, comprising
a transmitting chain for transmitting a radio signal;
a receiving chain for receiving an echo signal; and
a detector coupled with the receiving chain, the detector being configured for monitoring whether components are saturated when the receiving chain receives the echo signal; and
a controller connected with the transmitting chain, the receiving chain and the detector;
wherein the controller is configured for adjusting gains for the transmitting chain and/or the receiving chain based on saturation information output by the detector in an automatic gain control (AGC) phase,
wherein the receiving chain comprises a low noise amplifier (LNA), a trans-impedance amplifier (TIA), a first variable gain amplifier VGA, and a second variable gain amplifier connected sequentially to process the echo signal;
wherein the detector is connected to an output interface of the TIA, an output interface of the first variable gain amplifier and/or an output interface of the second variable gain amplifier, so as to in real time detect the saturation information of the TIA, the first variable gain amplifier and/or the second variable gain amplifier in processing the echo signal.

17. The sensor of claim 16, wherein the detector comprises a first detector, a second detector and a third detector,
the first detector is connected to the output interface of the TIA, and the first detector is configured to detect and output first saturation information of the TIA in processing the echo signal;
the second detector is connected to the output interface of the first variable gain amplifier to detect and output second saturation information of the first variable gain amplifier in processing the echo signal; and
the third detector is connected to the output interface of the second variable gain amplifier to detect and output third saturation information of the second variable gain amplifier in processing the echo signal;
wherein the controller is configured to adjust the gains for the transmitting chain and/or the receiving chain based on the first saturation information, the second saturation information and the third saturation information, to realize AGC.

* * * * *